US009625541B2

(12) United States Patent
Fontius et al.

(10) Patent No.: US 9,625,541 B2
(45) Date of Patent: Apr. 18, 2017

(54) SAFETY TESTS FOR SYSTEMS MONITORING LOCAL SAR

(71) Applicants: Jörg Ulrich Fontius, Neunkirchen A. Brand (DE); Holger Adolf, Zirndorf (DE); Thomas Benner, Erlangen (DE); Hans-Peter Fautz, Forchheim (DE); Matthias Gebhardt, Erlangen (DE); Rene Gumbrecht, Herzogenaurach (DE)

(72) Inventors: Jörg Ulrich Fontius, Neunkirchen A. Brand (DE); Holger Adolf, Zirndorf (DE); Thomas Benner, Erlangen (DE); Hans-Peter Fautz, Forchheim (DE); Matthias Gebhardt, Erlangen (DE); Rene Gumbrecht, Herzogenaurach (DE)

(73) Assignee: Siemens Aktiengesellschaft, München (DE)

( * ) Notice: Subject to any disclaimer, the term of this patent is extended or adjusted under 35 U.S.C. 154(b) by 768 days.

(21) Appl. No.: 13/933,083

(22) Filed: Jul. 1, 2013

(65) Prior Publication Data

US 2015/0002147 A1    Jan. 1, 2015

(51) Int. Cl.
*G01V 3/00*    (2006.01)
*G01R 33/28*   (2006.01)
*G01R 33/36*   (2006.01)

(52) U.S. Cl.
CPC .......... *G01R 33/288* (2013.01); *G01R 33/36* (2013.01)

(58) Field of Classification Search
USPC ...................................................... 324/309
See application file for complete search history.

(56) References Cited

U.S. PATENT DOCUMENTS

| | | | |
|---|---|---|---|
| 2008/0157765 A1* | 7/2008 | Fontius | G01R 33/5612 |
| | | | 324/309 |
| 2010/0308825 A1* | 12/2010 | Brinker | G01R 33/288 |
| | | | 324/309 |
| 2010/0327868 A1 | 12/2010 | Gebhardt et al. | |
| 2011/0224924 A1 | 9/2011 | Eichfelder et al. | |
| 2011/0263969 A1 | 10/2011 | Fontius | |
| 2012/0256626 A1 | 10/2012 | Adalsteinsson et al. | |

(Continued)

OTHER PUBLICATIONS

Gumbrecht et al., Online Local SAR Supervision for Transmit Arrays at 7T, Nov. 2012, Siemens Healthcare.

(Continued)

*Primary Examiner* — Rodney Fuller
(74) *Attorney, Agent, or Firm* — Lempia Summerfield Katz LLC

(57) ABSTRACT

In order to provide online monitoring of local specific absorption rate (SAR) within a body subject to a magnetic resonance imaging (MRI) scan, directional couplers measure a phase and an amplitude of a transmission radio frequency (RF) pulse generated and transmitted by an MRI system. A measured local SAR value is calculated based on the measured phase and the measured amplitude of the transmission RF pulse using a voxel model of the body and an electromagnetic (EM) simulation. In order to verify proper operation of the local SAR monitoring, the measured local SAR value is compared to a predetermined local SAR value.

20 Claims, 4 Drawing Sheets

(56) References Cited

U.S. PATENT DOCUMENTS

2013/0147479 A1* 6/2013 Bielmeier .............. G01R 33/32
  324/309
2015/0002149 A1* 1/2015 Nehrke ................ G01R 33/243
  324/309

OTHER PUBLICATIONS

Gumbrecht et al., Safe Online Local SAR Calculation for Transmit Arrays Using Asynchron Data Processing, Nov. 2012, Siemens Healthcare.
MAGNETOM 7T, TimTX Array Step 2, 6 pages, Aug. 2012, www.siemens.com/7T-MRI.
Siemens, MAGNETOM 7T, Operator Manual—Tx Array System, pp. 43-66, Jul. 31, 2012.

\* cited by examiner

SAFETY TESTS FOR SYSTEMS MONITORING LOCAL SAR

FIELD

The present embodiments relate to safety tests for systems monitoring local specific absorption rate (SAR) during magnetic resonance imaging (MRI) scans.

BACKGROUND

Newer-generation magnetic resonance imaging (MRI) systems may generate and transmit a plurality of individual radio-frequency (RF) pulse trains in parallel over different independent radio-frequency transmit channels. Individual RF signals are applied to the individual transmit channels (e.g., the individual rods of a whole-body antenna).

Parallel transmission techniques, however, may increase peak pulse power, giving rise to concerns regarding excessive exposure to RF energy. The RF energy from an MRI scan may cause heating of the tissue of a body. One measure of RF absorption is the specific absorption rate (SAR), which specifies the deposited power per unit mass (watts/kg) due to the RF pulse. Inhomogeneity of an RF field (e.g., generated by the whole-body antenna) leads to one or more local exposures (e.g., hot spots) where a majority of the absorbed energy is applied (e.g., local SAR). Maximum values for SAR are specified by safety regulations and are to be met both globally (e.g., power absorbed by the whole body, such as the head of a patient) and locally (e.g., power absorbed per 10 grams of tissue). For example, a standardized limit of 4 watts/kg applies to the global SAR of a patient, and a standardized limit of 10 watts/kg applies to the local SAR for, for example, the head of the patient, according to an International Electrotechnical Commission (IEC) standard.

The value of SAR depends on the geometry of the part of the body that is exposed to the RF energy and the location and geometry of the RF source (e.g., the rods of the whole-body antenna). The SAR is based on the frequency-dependent conductivity of the tissue, the electric field, the tissue density, and scales with the square of the main magnetic field and with the square of the flip angle. Global SAR may be calculated by averaging the RF power absorbed per unit mass over the exposed tissue (e.g., the whole body). The global SAR may be monitored in real-time such that the global SAR does not exceed the standardized limit.

Online or real-time local SAR monitors for monitoring local SAR have not been used. Instead, a consistency check of played-out HF pulses is performed using set-point values.

SUMMARY

In order to provide online monitoring of local specific absorption rate (SAR) within a body subject to a magnetic resonance imaging (MRI) scan, directional couplers measure a phase and an amplitude of a transmission radio frequency (RF) pulse generated and transmitted by an MRI system. A measured local SAR value is calculated based on the measured phase and the measured amplitude of the transmission RF pulse using a voxel model of the body and an electromagnetic (EM) simulation. In order to verify proper operation of the local SAR monitoring, the measured local SAR value is compared to a predetermined local SAR value.

In one aspect, a method for testing a system for monitoring local SAR for a body within an MRI system is provided. The method includes receiving a measured phase and a measured amplitude of a transmission RF pulse generated and transmitted by the MRI system. A processor calculates a measured local SAR value based on the measured phase and amplitude of the transmission RF pulse. Operation of the system for monitoring local SAR is verified. The verifying includes comparing the measured local SAR value to a predetermined local SAR value.

In another aspect, a non-transitory computer-readable storage medium stores instructions executable by one or more processor to test a system for monitoring local SAR. The instructions include identifying a theoretical local SAR value based on a measurement protocol, the measurement protocol including a defined phase and amplitude for a defined transmission RF pulse. A measured phase and a measured amplitude of a transmission RF pulse generated based on the measurement protocol and transmitted by the MRI system are received. A measured local SAR value is calculated based on the measured phase and amplitude of the transmission RF pulse. A difference of the measured local SAR value to the theoretical local SAR value is compared with a predetermined threshold.

In yet another aspect, a system for testing a SAR monitor is provided. The system includes a processor configured to identify a theoretical local SAR value based on a measurement protocol. The measurement protocol includes defined phases and amplitudes for a plurality of parallel defined transmission RF pulses. The processor is further configured to receive measured phases and amplitudes of a plurality of parallel transmission RF pulses generated based on the measurement protocol, and transmitted through corresponding transmission channels of the MRI system. The processor is configured to calculate a measured local SAR value based on the measured phases and amplitudes of the plurality of parallel transmission RF pulses. The processor is further configured to compare the measured local SAR value to the theoretical local SAR value.

DETAILED DESCRIPTION

Figure 1:
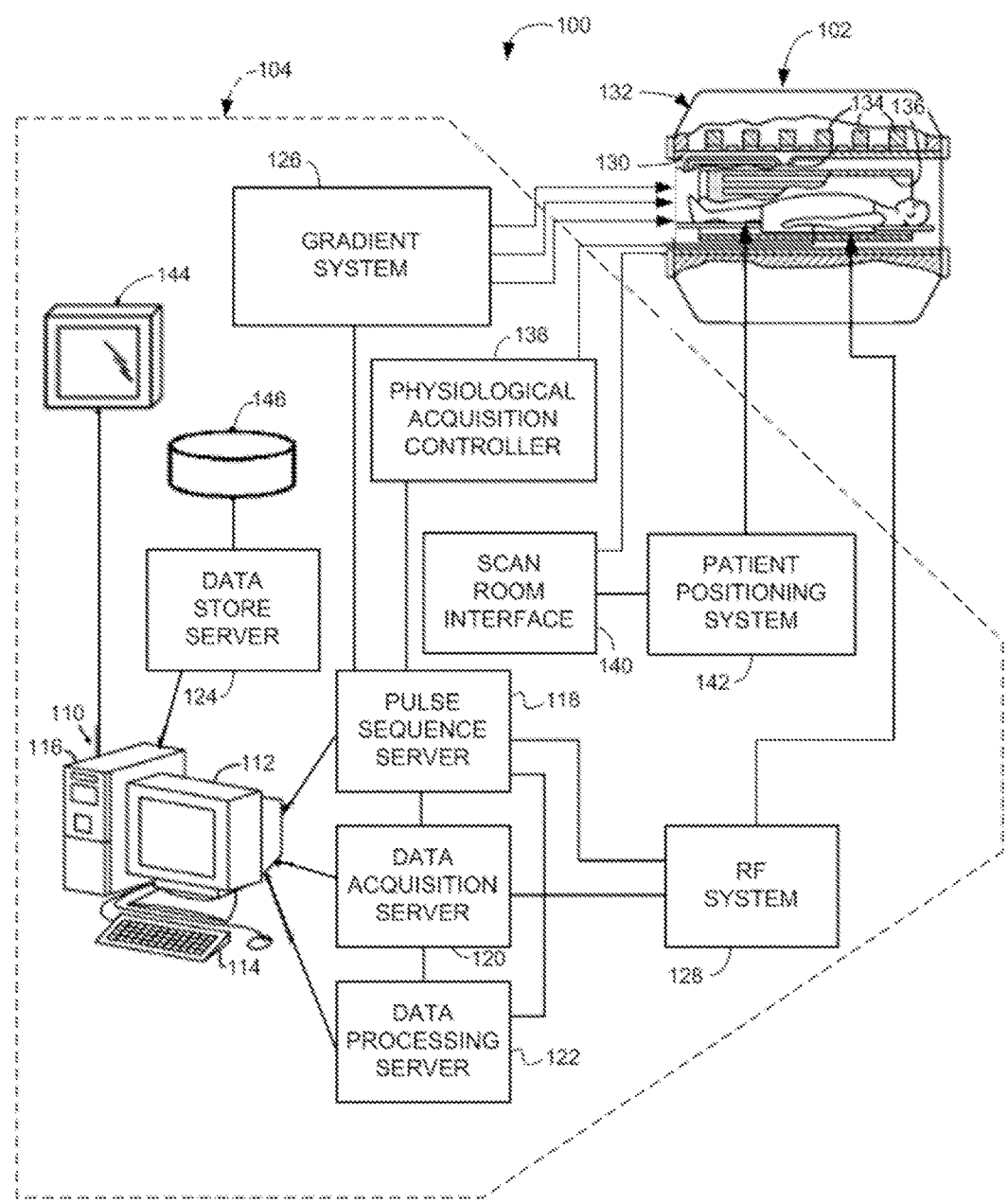
FIG. 1 shows one embodiment of a magnetic resonance imaging (MRI) system.

Newer-generation magnetic resonance imaging (MRI) systems may generate radio frequency (RF) pulses with a spatially tailored excitation pattern to mitigate $B_1^+$ inhomogeneity by exciting a spatial inverse of the inhomogeneity. In these systems, a plurality of individual RF pulse trains are transmitted in parallel over the different independent radio-frequency transmit channels. Individual RF signals are applied to the individual transmit channels (e.g., the individual rods of a whole-body antenna). This method, referred to as "parallel transmission" or "parallel excitation," exploits variations among the different spatial profiles of a multi-element RF coil array. Parallel excitation has enabled several important applications beyond the mitigation of $B_1^+$ inhomogeneity, including flexibly shaped excitation volumes.

Parallel transmission systems allow reduction of the duration of an RF pulse by increasing the amplitude and slew rates of the gradient coils of the system. For example, the excitation k-space trajectory may be undersampled (reducing the distance traveled in k-space), thus shortening the corresponding RF pulse. The ability to "accelerate" in the k-space domain arises due to the extra degrees of freedom provided by the system's multiple transmit elements.

Parallel transmission techniques, however, may increase peak pulse power, giving rise to concerns regarding excessive exposure to RF energy. In this context, the RF exposure may be defined by a physiological absorption of the RF irradiation, rather than the transmitted RF energy. A typical measure of the radio-frequency absorption is the specific absorption rate (SAR), which specifies the deposited power per unit weight (watts/kg) due to the RF pulse. Maximum values for SAR are specified by safety regulations and are to be met both globally (e.g., power absorbed by the whole head or whole body) and locally (e.g., power absorbed per 10 grams of tissue). For example, a standardized limit of 4 watts/kg applies to the global SAR of a patient according to an International Electrotechnical Commission (IEC) standard.

When multiple transmit channels are simultaneously employed, the local electric fields generated by each channel undergo local superposition, and local extremes in electric field magnitude may arise, leading to spikes in local SAR. The spikes in local SAR may lead to "hot spots," and parallel transmitted pulses may produce relatively high ratios of, for example, local to global average SAR. These relatively-high ratios of local to global average SAR make local SAR the limiting factor of parallel transmission MRI.

Parallel transmission (pTx) systems for RF pulses in MRI may generate more flexible magnetization profiles than is feasible with conventional single-channel RF systems. pTx systems may be limited by SAR constraints. While global or average SAR values are readily measured and easily amenable to incorporation as constraints in the pTx RF pulse design, local SAR is not measurable in the prior art.

In one or more of the present embodiments described below, a local SAR monitor for online local SAR monitoring is provided. For determining local SAR in a magnetic resonance (MR) procedure, the high frequency (HF) pulse envelope (e.g., the HF phase and the HF amplitude) of the transmission pulses of all active transmission channels is measured. A local SAR monitor includes, for example, directional couplers used for measuring a forward HF wave and a reflected HF wave. From this data (e.g., the HF phase and the HF amplitude of the forward HF wave and the reflected HF wave), the local SAR in the patient may be determined with the aid of a voxel model of the patient and electromagnetic (EM) simulation (e.g., the virtual observation points (VOP) method).

Since hardware components of the local SAR monitor (e.g., the directional couplers) may drift or have defects, the local SAR monitor may be tested to verify proper operation. The methods for testing the SAR monitor may be as automatic as possible and may be performed regularly.

To test the system for determining local SAR, a defined termination of the transmission path (e.g., an open terminus or coil) may be used. Transmission to the defined termination is executed using a generated measurement protocol. The defined measurement protocol includes defined HF transmission phases and amplitudes for all the transmission channels. The local SAR is measured and calculated in the voxel model for one or more representative local points using the SAR monitor, and compared with set-point values ascertained prior to the test, for example, for the open terminus with the HF pulses applied.

If the comparison is satisfactory (e.g., the difference is within a predetermined threshold), the measured local SAR may match the set-point values within a specification period. If components drift or stop functioning, then the measured local SAR would deviate from the specified set-point value and would thus fail the safety test.

A shutoff test may also be run. HF pulses that, according to the simulation calculation, cause local SAR limit values to be exceeded may be transmitted. The shutoff test is successfully passed if the SAR monitor detects the surpassing of the limit value and resets the MRI system to a safe state (e.g., off).

FIG. 1 shows one embodiment of an MRI system 100. The MRI system 100 may include a scanner or data acquisition unit 102 and a control system 104 for directing the operation of the scanner 102. The control system 104 includes a workstation 110 having one or more output interfaces 112 (e.g., a display) and one or more input interfaces 114 (e.g., a keyboard). The workstation 110 includes a processor 116, which may be a commercially available, programmable machine running a commercially available operating system. The workstation 110 provides an operator interface that enables scan sequences to be entered into or otherwise defined for the control system 104 and the MRI system 100. The workstation 110 may be coupled to a number of servers including, for example, a pulse sequence server 118, a data acquisition server 120, a data processing server 122, and a data store server 124. The workstation 110 and the servers 118, 120, 122 and 124 may communicate with each other via any desired communication technique, protocol, or standard. The components of the control system 104 may be coupled to one another via a data bus or network (not shown) and need not be connected via respective, dedicated communication lines, as shown. Any one or more of the components of the control system 104 may be implemented as a service unit, module, or other unit implemented by a common physical machine or other device. Additional, different, or fewer components may be provided, such as combining two or more servers or providing the workstation functionality on a server or vice versa.

The processor 116 or a processor of any of the servers 118, 120, 122, and 124 is a general processor, a central processing unit, a control processor, a graphics processor, a digital signal processor, a three-dimensional rendering processor, an image processor, an application-specific integrated circuit, a field-programmable gate array, a digital circuit, an analog circuit, combinations thereof, or other now known or later developed devices. The processor is a single device or multiple devices operating in serial, parallel, or separately. The processor may be a main processor of a computer, such as a laptop or desktop computer, or may be a processor for handling some tasks in a larger system. The processor is configured by instructions, design, hardware, and/or software to perform the acts discussed herein, such as testing a system for monitoring local SAR for a body within the MRI system 100.

The pulse sequence server 118 functions in response to instructions downloaded from the workstation 110 to operate a gradient system 126 and an RF system 128. Gradient waveforms to perform the prescribed scan are produced and applied to the gradient system 126. The gradient system 126 excites gradient coils in a gradient coil assembly 130 to produce the magnetic field gradients $G_x$, $G_y$, and $G_z$ used for position-encoding MR signals. The gradient coil assembly 130 forms part of a magnet assembly 132, which includes an annular or other polarizing magnet 134 and a whole-body RF coil array 136. In some cases, the whole-body RF coil array 136 is constructed in the form of a birdcage antenna and has a number of individual antenna rods that run parallel to the patient tunnel and are uniformly distributed in a circumferential arrangement around the patient tunnel. The individual antenna rods may be capacitively coupled to one another in a ring shape at one end of the birdcage antenna.

RF excitation waveforms are applied to the RF coil 136 by the RF system 128 to perform a selected magnetic resonance pulse sequence. Responsive MR signals detected by the RF coil 136 or a separate local coil (not shown) are received by the RF system 128, amplified, demodulated, filtered and digitized under direction of the pulse sequence server 118. The RF system 128 includes an RF transmitter for producing a wide variety of RF pulses used in MR pulse sequences. The RF transmitter is responsive to the selected scan sequence and direction from the pulse sequence server 118 to produce RF pulses of the desired frequency, phase and pulse amplitude waveform. The generated RF pulses may be applied to the whole body RF coil 136 or to one or more local coils or coil arrays. As described below, the RF transmitter includes a plurality of transmission channels to produce RF pulses formed via the superimposition of the RF pulses generated by each transmission channel.

The RF system 128 also includes one or more RF receiver channels. Each RF receiver channel includes an RF amplifier that amplifies the MR signal received by the coil to which the RF receiver channel is connected. Each receiver may also include a detector that collects and digitizes in-phase (I) and quadrature (Q) components of the received MR signal.

The pulse sequence server 118 may receive patient data from a physiological acquisition controller 138. The controller 138 receives signals from a number of different sensors connected to the patient, such as ECG signals from electrodes or respiratory signals from a bellows. Such signals may be used by the pulse sequence server 118 to synchronize, or "gate", the implementation of the scan sequence with the subject's respiration or heart beat.

The pulse sequence server 118 also connects to a scan room interface circuit 140 that receives signals from various sensors associated with the condition of the patient or subject and the magnet system. It is also through the scan room interface circuit 140 that a subject positioning system 142 receives commands to move the subject to desired positions during the scan sequence. The subject positioning system 142 may direct one or more motors (not shown) that drive a bed and, thus, the subject, to a desired position.

The digitized MR signal samples produced by the RF system 128 are received by the data acquisition server 120. The data acquisition server 120 operates in response to instructions downloaded from the workstation 110 to receive the real-time MR data and provide buffer storage such that no data is lost by data overrun. In some scan sequences, the data acquisition server 120 does little more than pass the acquired MR data to the data processor server 122. However, in scans that require information derived from acquired MR data to control the further performance of the scan, the data acquisition server 120 is programmed to produce such information and convey the information to the pulse sequence server 118. For example, during calibration or other pre-scans, MR data is acquired and used to calibrate the pulse sequence performed by the pulse sequence server 118. The calibration data may be stored in a memory or storage device or other unit of, associated with, or in communication with, any of the aforementioned servers or other devices.

Memory of any of the servers may be computer readable storage media. The computer readable storage media may include various types of volatile and non-volatile storage media, including but not limited to random access memory, read-only memory, programmable read-only memory, electrically programmable read-only memory, electrically erasable read-only memory, flash memory, magnetic tape or disk, optical media and the like. The memory may be a single device or a combination of devices. The memory may be adjacent to, part of, networked with and/or remote from the processor.

Navigator signals may be acquired during a scan and used to adjust RF or gradient system operating parameters or to control the view order in which k-space is sampled. The data acquisition server 120 may be employed to process MR signals used to detect the arrival of contrast agent in a magnetic resonance angiography (MRA) scan. In all these examples, the data acquisition server 120 acquires MR data and processes the MR data in real-time to produce information that is used to control the scan.

The data processing server 122 receives MR data from the data acquisition server 120 and processes the MR data in accordance with instructions downloaded from the workstation 110. Alternatively, the data processing server 122 receives the MR data directly from the RF system 128. Such processing may include, for example, Fourier transformation of raw k-space MR data to produce two or three-dimensional images, the application of filters to a reconstructed image, the performance of back-projection image reconstruction of acquired MR data, the calculation of functional MR images, the calculation of motion or flow images, segmentation, or other visualization processes.

Images reconstructed by the data processing server 122 are conveyed back to the workstation 110 for storage. Real-time images may be stored in a database memory cache (not shown) from which the images may be output to the display 112 or an auxiliary terminal or console 144, which may be located near the magnet assembly 132 for use by attending physicians or other operators. Batch mode images or selected real time images are stored in a database on mass storage device 146, which may include any desired storage medium. When such images have been reconstructed and transferred to storage, the data processing server 122 notifies the data store server 124 on the workstation 110. The workstation 110 may be used by an operator to archive the images, produce films, or send the images via a network to other facilities.

Figure 2:
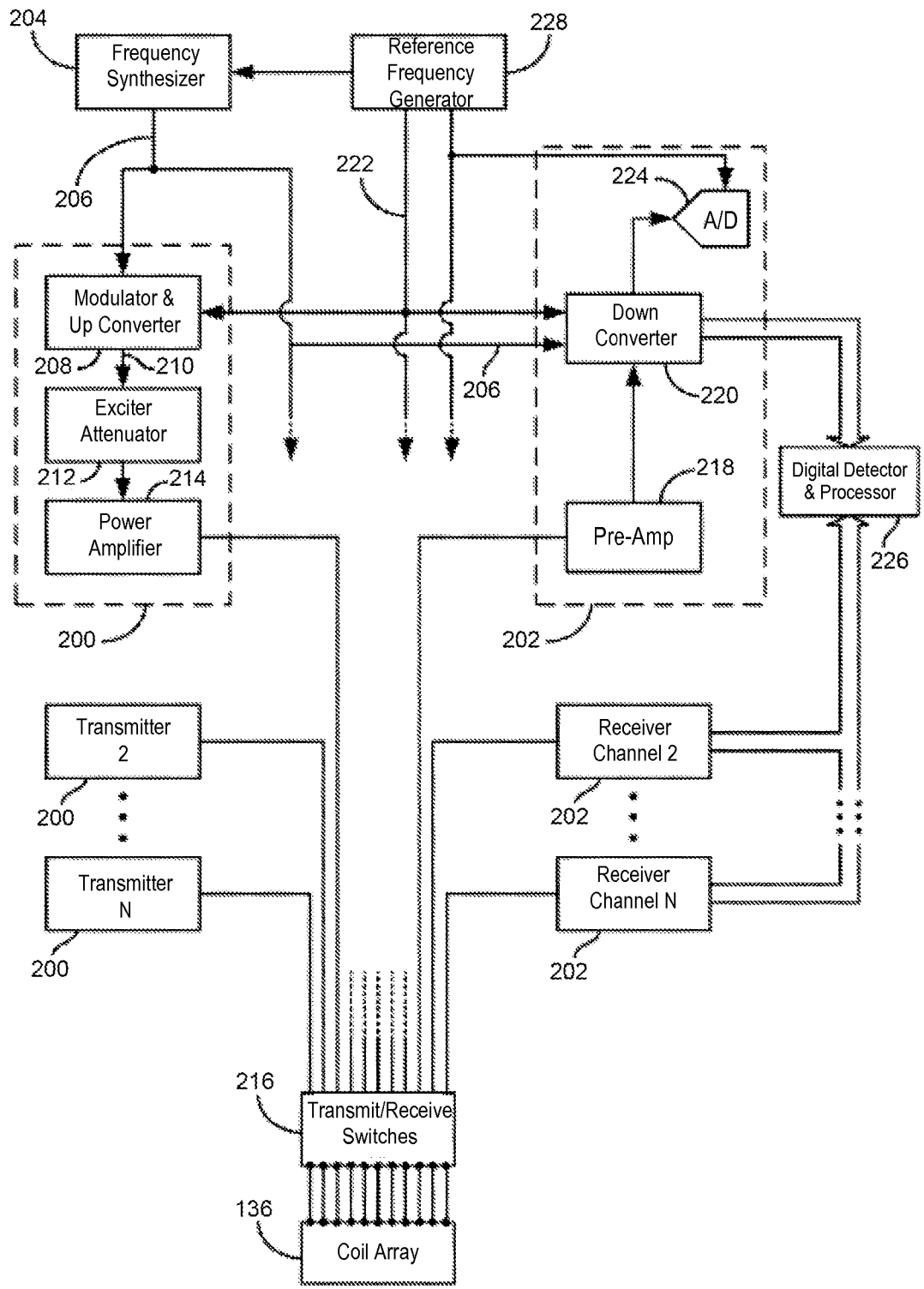
FIG. 2 shows one embodiment of a radio frequency (RF) system and other components of the MRI system of FIG. 1.

As shown in FIG. 2, the RF system 128 and other components of the system 100 are shown in greater detail. The whole body coil array 136 may include a plurality of coil elements that may be separately driven by a plurality of RF transmitters 200 to produce a desired RF field-of-excitation ("FOX"). Each RF transmitter 200 forms one of the array of channels that, when superimposed, collectively define the composite RF signal. The coil array 136 may also be used with a plurality of receive channels 202. Alternatively or additionally, another whole body RF coil array (not shown) or another local RF coil may be used to receive the MR signals. A variety of different coil array structures may be used as part of the system 100 (FIG. 1).

The RF system 126 includes a set of transmitters 200, each of which produces an individual, selected RF excitation field. The base, or carrier, frequency of this RF excitation field is produced under control of a frequency synthesizer 204, which receives a set of digital control signals from the pulse sequence server 118. These control signals may include data representative of the frequency and phase of the RF carrier signal, which may be produced at an output 206. The RF carrier is applied to a modulator and up converter 208 in each transmitter 200, where the amplitude of the RF carrier is modulated in response to a signal also received from the pulse sequence server 118. The signal defines the envelope of the RF excitation pulse to be produced and is generated by sequentially reading out a series of stored digital values. These stored digital values may be changed to enable any desired RF pulse envelope to be produced by each transmitter 200.

The magnitude of the RF excitation pulse produced at an output 210 is attenuated by an exciter attenuator circuit 212 in each transmitter 200. Each attenuator circuit 212 receives a digital command from the pulse sequence server 118. The attenuated RF excitation pulses are applied to a power amplifier 214 in each transmitter 200. The power amplifiers 214 are current source devices that connect to respective transmit inputs on a set of transmit/receive switches 216. In this example, a desired number N of the transmitters 200 are employed and connected through a corresponding number N of the transmit/receive switches 216 to a corresponding number N of the coil elements in the RF coil array 136.

The signal produced by the subject is picked up by the coil array 136 and applied to the inputs of the set of receive channels 202. A pre-amplifier 218 in each receiver channel 202 amplifies the signal by an amount determined by a digital attenuation signal received from the pulse sequence server 118 (FIG. 1). The received signal is at or around the Larmor frequency, and this high frequency signal is down converted in a two-step process by a down converter 220, which first mixes the NMR signal with the carrier signal on the line 206, and then mixes the resulting difference signal with a reference signal on a line 222. The down converter NMR signal is applied to the input of an analog-to-digital ("A/D") converter 224, which samples and digitizes the analog signal and applies the digital signal to a digital detector and signal processor 226 (e.g., MR receiver). The digital detector and signal processor 226 produces 16-bit in-phase (I) values and 16-bit quadrature (Q) values corresponding to the received signal. Other numbers of bits may be used. The resulting stream of digitized I and Q values of the received signal are output to the data acquisition server 120 (FIG. 1) and/or the data processing server 122. The reference signal as well as the sampling signal applied to the A/D converter 224 are produced by a reference frequency generator 228.

The transmit/receive switches 216 are controlled and directed by the pulse sequence server 118 (FIG. 1) to connect the N transmitters 200 to the N coil elements in the coil array 136 during those parts of the pulse sequence in which an RF field is to be produced. Each transmitter 200 is separately controlled by the pulse sequence server 118 (FIG. 1) to produce an RF field of a desired amplitude, frequency, phase, and envelope at each of the N coil elements. The combined RF fields of the N coil elements produce the prescribed $B_1$ field throughout the region of interest in the subject during the imaging phase of the procedure. Other arrangements for creating the $B_1$ field in MR may be used.

When the $B_1$ field is not produced, the pulse sequence server 118 directs the transmit/receive switches 216 to connect each of the N receive channels to the respective N coil elements. Signals produced by the excited spins in the subject are picked up and separately processed, as described above.

Figure 3:
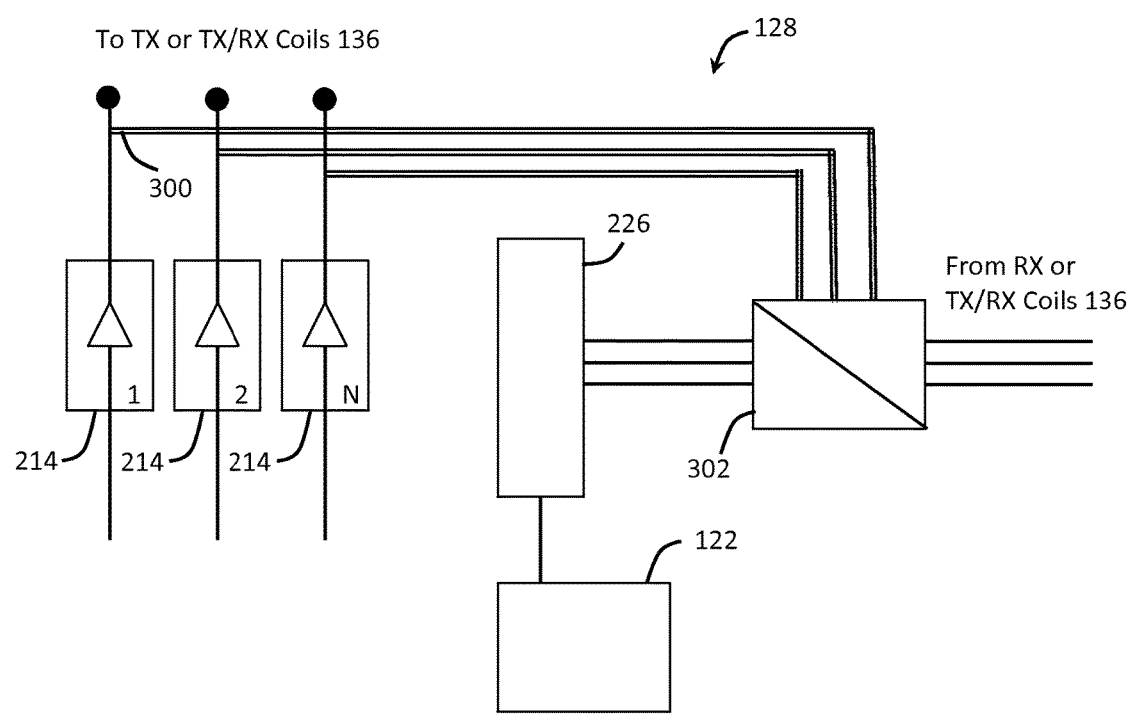
FIG. 3 shows one embodiment of an RF system including a local SAR monitor.

FIG. 3 shows the RF system 128 of FIG. 2 including one embodiment of a local SAR monitor. The RF system 128 includes, for example, eight parallel transmission channels. The RF system 128 may include more or fewer transmission channels. In one embodiment, the RF system 128 only includes one transmission channel.

The RF system 128 includes one or more directional couplers 300. Directional couplers are passive devices that couple a defined amount of electromagnetic power in a transmission channel to a port enabling the signal to be used in another circuit. The number of directional couplers 300 may correspond to the number of transmission channels. For example, the RF system 128 may include eight directional couplers 300. The directional couplers 300 may be in communication with the transmission channels at locations adjacent to the coil array 136.

The directional couplers 300 measure the high frequency (HF) pulse envelope of the RF transmission pulses generated by and transmitted through the RF system 128. The directional couplers 300 connect to the MR coils 136 or to lines connecting the transmitters 200 to the coil array 136. The HF pulse envelope includes HF phase and amplitude. The directional couplers 300 measure the forward HF wave and the reflected HF wave. In one embodiment, the phase and amplitude measured may be based on the forward waves. The coils 136 may reflect some of the RF pulse back to the transmitters 200. In another embodiment, the phase and amplitude measured may be based on the forward and reflected waves (e.g., a combination of the forward and reflected waves).

The measured HF phases and amplitudes of the RF transmission pulses (e.g., measured signals) are transmitted to the MR receiver 226 via a switch 302. In one embodiment, the switch 302 is a 32-channel switch matrix. Other switches may be used. The switch 302 allows standard MR receivers 226 to be used for SAR and for MR reception, such that extra MR receivers 226 are not needed for online local SAR monitoring. The switch 302 may be operated such that when the RF transmission pulses are being transmitted, the MR receivers 226 are receiving the measured HF pulse envelope from the directional couplers 300, and when responsive MR signals are detected by the RF coil 136 or the separate local coil (not shown), the MR receivers 226 are receiving the responsive MR signals detected by the RF coil 136 for further processing.

The data processing server 122 or another server or processor is in communication with the MR receivers 226 and calculates local SAR based on the measured HF pulse envelope. The local SAR is calculated using the measured HF pulse envelope as an input to compressed E-field models (e.g., VOPs obtained by EM-field simulations; described in more detail below) run in the data processing server 122. The data processing server 122, for example, may calculate the local SAR within 10 ms of the RF transmission pulses being transmitted. In other embodiments, the local SAR may be calculated more or less quickly. The local SAR monitor provides online local SAR calculation within a short time period after RF transmission pulses are transmitted.

The RF system 128 may include more or fewer components. For example, the RF system 128 may also include an energy chain and a corresponding plug/connector connecting the transmitters 200 to the coil array 136.

Since the hardware components of the local SAR monitor may drift or have defects (e.g., broken cables from the directional couplers 300), tests to verify proper operation of the local SAR monitor may be performed regularly. The tests to verify proper operation of the local SAR monitor may also be performed automatically or semi-automatically.

Figure 4:
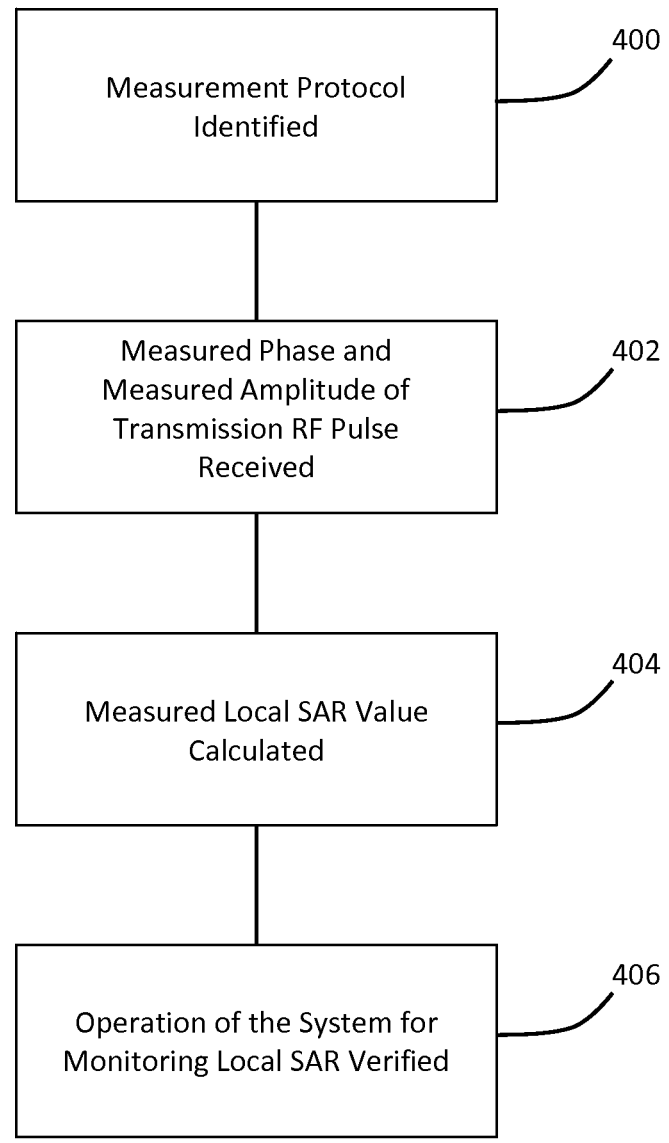
FIG. 4 shows a flowchart of one embodiment of a method for testing a system for monitoring local SAR.

FIG. 4 shows a flowchart of one embodiment of a method for testing a system for monitoring local SAR for a body within an MRI system. The method may be performed using the MRI system 100 of FIGS. 1-3 or another MRI system. The method is implemented in the order shown, but other orders may be used. Additional, different, or fewer acts may be provided. Similar methods may be used for testing a system for monitoring local SAR.

In act 400, a measurement protocol is identified. The identified measurement protocol includes defined phases and amplitudes for transmission RF pulses to be transmitted by an RF system (e.g., including one or more transmission channels, one or more reception channels, and a coil array) of the MRI system. The identified measurement protocol may also include defined terminations of the one or more transmission channels. The RF system may include a plurality of transmission channels operable to simultaneously transmit a plurality of parallel RF transmission pulses, and the identified measurement protocol may include a plurality of corresponding defined phases and amplitudes for the transmission RF pulses. Alternatively, the RF system may include a single transmission channel operable to transmit a single corresponding RF transmission pulse, and the identified measurement protocol may include a phase and an amplitude for the single transmission RF pulse.

A processor of a pulse sequence server, other processor, a workstation, or any of the other servers of the MRI system may identify the measurement protocol. The processor may retrieve the measurement protocol stored in a memory of the pulse sequence server, the workstation, any of the other servers, or another memory. The processor may retrieve the measurement protocol stored in the memory based on instructions received from a user via one or more input interfaces of the workstation, for example. Alternatively, the processor may receive measurement protocol directly from the user via one or more input interfaces.

A defined termination of the transmission path may be used for the testing. For example, an open terminus or coil may be use. Transmission to the defined termination is executed using the identified measurement protocol and the RF system. The testing may be conducted without any patients being disposed in the MRI system.

In act 402, a measured phase and a measured amplitude (e.g., an HF pulse envelope) of a transmission RF pulse generated and transmitted by the MRI system are received. After transmission of the plurality of parallel transmission RF pulses via the plurality of transmission channels, for example, the measured phases and the measured amplitudes of the transmission RF pulses may be received at one or more MRI receivers or any of the servers of the MRI system. The measured phases and the measured amplitudes of the transmission RF pulses may be measured by directional couplers in communication with the plurality of transmission channels. The directional couplers may be in communication with the transmission channels at locations adjacent to the coil array (e.g., a birdcage antenna) of the RF system. The directional couplers may measure both the forward HF wave and the reflected HF wave.

The measured phases and the measured amplitudes of the plurality of parallel transmission RF pulses may be received from the directional couplers, via a switch. In one embodiment, the switch may be a 32-channel switch matrix. Other switches may be used. The switch allows standard MR receivers to be used without sacrificing receiver channels. The switch may be operated such that when the RF transmission pulses are being transmitted, the MR receivers are receiving the measured phases and the measured amplitudes from the directional couplers, and when responsive MR signals are detected by the RF coil array or the separate local coil, the MR receivers are receiving the responsive MR signals detected by the RF coil for further processing.

In act 404, a processor calculates a measured local SAR value based on the measured phase and amplitude of the transmission RF pulse. The processor may be a processor of a data processing server, other processor, the workstation, or any of the other servers. The processor uses the measured phases and the measured amplitudes received from the directional couplers in a mathematical model representing a body (e.g., part or all of the patient) and the coil array of the MRI system.

The processor may identify the mathematical model for calculating the measured local SAR value. For example, the mathematical model may be stored in the memory, and the processor may identify the mathematical model based on the geometry of the coil array used and/or the geometry of the body (e.g., the patient) or part of the body to be imaged. In other words, the stored mathematical model may be one mathematical model of a plurality of stored mathematical models and may correspond to the geometry of the coil array used and/or the geometry of the patient to be imaged. Alternatively, a single model is stored and used.

In one embodiment, the processor may generate the mathematical model. The processor may generate the mathematical model using, for example, the VOP method. A model of the body to be scanned by the MRI system may be generated using the MRI system or another imaging system. The processor may compress the model of the body to be scanned into a plurality of voxel clusters. Each cluster of the plurality of voxel clusters defines a virtual observation point with a peak sensitivity to local SAR for the voxel cluster. The processor assigns each voxel cluster of the plurality of voxel clusters to a hotspot, and establishes a sensitivity matrix for each of the hotspots. The processor calculates one or more local SAR values corresponding to the one or more hotspots by inputting the measured phases and the measured amplitudes received from the directional couplers into one or more of the sensitivity matrices. The VOP method is described in greater detail in U.S. Publication No. 2011/0224924, which is herein incorporated by reference in its entirety. Other mathematical models may be used to calculate the local SAR value.

In one embodiment, the measured local SAR value is calculated within 10 ms of the plurality of parallel transmission RF pulses being transmitted. This short time period allows the local SAR to be monitored online. In other embodiments, the measured local SAR value may be calculated in more or less time after the plurality of parallel transmission RF pulses are transmitted.

In act 406, operation of the system for monitoring local SAR is verified. The verifying includes comparing the measured local SAR value to a predetermined local SAR value.

In a first test, the measured local SAR value is compared to a theoretical local SAR value. The theoretical local SAR value may be predetermined, and the processor may identify the theoretical local SAR value. In one embodiment, the theoretical local SAR value may be calculated off-line and stored in a memory of the data processing server, the workstation, any of the other servers, or another memory. The processor may identify the theoretical local SAR value from a plurality of stored theoretical local SAR values based on the identified measurement protocol, the geometry of the coil array (e.g., the defined terminations of the transmission paths), other parameters for the MRI system, the geometry of body to be scanned, or a combination thereof. In other words, the memory may store and the processor may identify a predetermined theoretical local SAR value corresponding to specifications of the MRI system and specifications of the body to be scanned.

Prior to execution of the identified measurement protocol, the processor may input the identified measurement protocol into the mathematical model of act 404 or another mathematical model to calculate the theoretical local SAR. For example, the other mathematical model may require greater processing and generally may be more accurate than the mathematical act of act 404, as the theoretical local SAR value may be calculated off-line.

The measured local SAR value is compared to the theoretical local SAR value to determine whether the measured local SAR value matches the theoretical local SAR value within a predetermined threshold. The measured local SAR value may be compared to the theoretical local SAR value for one or a plurality of hotspot locations. In one embodiment, the processor may calculate the difference between the measured local SAR value and the theoretical local SAR value. The predetermined threshold may be a difference amount or a percent difference. The predetermined threshold may be stored in the memory or may be received from the user via the one or more input interfaces of the workstation, for example, prior to the test of the local SAR monitor.

If the comparison is satisfactory (e.g., the calculated difference is within the predetermined threshold), then proper operation of the local SAR monitor is verified. In one embodiment, proper operation of the local SAR monitor may be assumed for a specified period (e.g., defining the amount of time between subsequent tests) when the comparison is satisfactory. If components drift or stop functioning, then the measured local SAR value would deviate from the theoretical local SAR value and would thus fail the safety test.

In a second test, an MRI system shutoff is run. For the second test, the identified measurement protocol defines RF pulses that, according to the corresponding theoretical local SAR value predetermined with the mathematical model, for example, exceed a predetermined local SAR limit value. The predetermined local SAR limit value may, for example, be 10 watts/kg at the head of the patient, as defined by the IEC standard. Other predetermined local SAR limit values may be used. The predetermined local SAR limit value may, for example, be stored in the memory and identified by the processor, or may be received directly from the user via the one or more input interfaces of the workstation.

The identified measurement protocol is executed, and the MRI system shutoff test is successfully passed if the local SAR monitor detects the surpassing of the predetermined local SAR limit value and resets the MRI system to a safe state (e.g., a predetermined operating state of the MRI system). In one embodiment, the safe state is the MRI system being turned off. Other safe states may be used.

Since hardware components of the local SAR monitor (e.g., the directional couplers) may drift or have defects, one or more of the present embodiments may be used to regularly verify proper operation of the local SAR monitor. A properly operating local SAR monitor will prevent the patient from being excessively exposed to RF energy and corresponding heating of the patient from such excessive RF energy.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for testing a system for monitoring local specific absorption rate (SAR) for a body within a magnetic resonance imaging (MRI) system, the method comprising:
   receiving a measured phase and a measured amplitude of a transmission radio frequency (RF) pulse generated and transmitted by the MRI system;
   calculating, by a processor, a measured local SAR value based on the measured phase and amplitude of the transmission RF pulse;
   verifying accurate operation of the system for monitoring local SAR with respect to a predetermined local SAR value, the verifying comprising comparing the measured local SAR value to the predetermined local SAR value; and
   resetting the MRI system to a predetermined safe state based on the comparison.

2. The method of claim 1, wherein the predetermined local SAR value is a predetermined local SAR limit value, and
   wherein the resetting comprises the MRI system to the predetermined safe state when the measured local SAR value exceeds the predetermined local SAR limit value.

3. The method of claim 1, wherein calculating the measured local SAR value comprises calculating the measured local SAR value at one or more representative positions within a model of the body.

4. The method of claim 1, wherein the receiving comprises receiving the measured phase and the measured amplitude of the transmission RF pulse from a directional coupler.

5. The method of claim 1, wherein the calculating comprises inputting the received measured phase and measured amplitude of the transmission RF pulse into a mathematical model representing the body and a transmission coil of the MRI system.

6. The method of claim 5, further comprising generating the mathematical model, the generating comprising compressing a model of the body to be scanned by the MRI system into a plurality of voxel clusters, each voxel cluster of the plurality of voxel clusters defining a virtual observation point with a peak sensitivity to local SAR for the voxel cluster.

7. The method of claim 6, wherein generating the mathematical model further comprises:
   assigning each voxel cluster of the plurality of voxel clusters to a hotspot; and
   establishing a sensitivity matrix for each of the hotspots.

8. The method of claim 5, further comprising:
   identifying a measurement protocol, the identified measurement protocol comprising a defined phase and a defined amplitude for the transmission RF pulse, and a defined termination of a transmission line operable to transmit the transmission RF pulse; and
   calculating a theoretical local SAR value based on the identified measurement protocol, the calculating of the theoretical local SAR value comprising inputting at least a portion of the identified measurement protocol into the mathematical model or another mathematical model, wherein the predetermined local SAR value is the theoretical local SAR value, and wherein the comparing comprises comparing the measured local SAR value to the theoretical local SAR value to determine whether the measured local SAR value matches the theoretical local SAR value within a predetermined threshold.

9. The method of claim 1, wherein the calculating comprises calculating the measured local SAR value within 10 ms of the transmission RF pulse being transmitted.

10. The method of claim 1, wherein comparing the measured local SAR value to the predetermined local SAR value comprises:

calculating a difference between the measured local SAR value and the predetermined local SAR value; and comparing the calculated difference to a predetermined threshold, wherein accurate operation of the system for monitoring local SAR is verified when the calculated difference is less than the predetermined threshold.

11. In a non-transitory computer-readable storage medium that stores instructions executable by one or more processors to test a system for monitoring local specific absorption rate (SAR), the instructions comprising:

identifying a theoretical local SAR value based on a measurement protocol, the measurement protocol comprising a defined phase and amplitude for a defined transmission radio frequency (RF) pulse;

receiving a measured phase and a measured amplitude of a transmission RF pulse generated based on the measurement protocol, and transmitted by a magnetic resonance imaging (MRI) system;

calculating a measured local SAR value based on the measured phase and amplitude of the transmission RF pulse;

verifying accurate operation of the system for monitoring local SAR with respect to a predetermined threshold, the verifying comprising comparing a difference of the measured local SAR value to the theoretical local SAR value with the predetermined threshold; and resetting the MRI system to a predetermined safe operating state when the difference exceeds the predetermined threshold.

12. The non-transitory computer-readable storage medium of claim 11, wherein the instructions further comprise identifying the measurement protocol, wherein the identifying of the theoretical local SAR value comprises calculating the theoretical local SAR value based on the identified measurement protocol, the calculating of the theoretical local SAR value comprising inputting the defined phase and amplitude for the defined transmission RF pulse into a mathematical model representing the body and a transmission coil of the MRI system, and wherein the calculating of the measured local SAR value comprises inputting the measured phase and amplitude of the transmission RF pulse into the mathematical model or another mathematical model representing the body and the transmission coil of the MRI system.

13. The non-transitory computer-readable storage medium of claim 12, wherein the receiving comprises receiving measured phases and measured amplitudes of a plurality of parallel transmission RF pulses generated by the MRI system, the plurality of parallel transmission RF pulses comprising the transmission RF pulse, and wherein the calculating of the measured local SAR value comprises inputting the measured phases and the measured amplitudes of the plurality of parallel transmission RF pulses into the mathematical model or the other mathematical model representing the body and a plurality of transmission coils of the MRI system, the plurality of transmission coils comprising the transmission coil.

14. The non-transitory computer-readable storage medium of claim 12, wherein the calculating of the measured local SAR value comprises inputting the measured phase and amplitude of the transmission RF pulse into the other mathematical model, and wherein the mathematical model requires more data processing than the other mathematical model.

15. The non-transitory computer-readable storage medium of claim 11, wherein the instructions further comprise comparing the measured local SAR value to a predetermined local SAR limit value.

16. The non-transitory computer-readable storage medium of claim 11, wherein the receiving comprises receiving the measured phase and the measured amplitude of the transmission RF pulse from a directional coupler.

17. A system for testing a specific absorption rate (SAR) monitor, the system comprising:

a processor configured to:

identify a theoretical local SAR value based on a measurement protocol, the measurement protocol comprising defined phases and amplitudes for a plurality of parallel defined transmission radio frequency (RF) pulses;

receive measured phases and amplitudes of a plurality of parallel transmission RF pulses generated based on the measurement protocol, and transmitted through corresponding transmission channels of a magnetic resonance imaging (MRI) system;

calculate a measured local SAR value based on the measured phases and amplitudes of the plurality of parallel transmission RF pulses; and verify accurate operation of the system for testing the SAR monitor with respect to the theoretical local SAR value, the verification comprising comparison of the measured local SAR value to the theoretical local SAR value;

reset the MRI system to a predetermined safe operating state based on the comparison.

18. The system of claim 17, further comprising a plurality of directional couplers in communication with the transmission channels, wherein the plurality of directional couplers are configured to measure the phases and the amplitudes of the plurality of parallel transmission RF pulses, and wherein the processor is configured to receive the measured phases and amplitudes of the plurality of parallel transmission RF pulses from the plurality of directional couplers.

19. The system of claim 18, further comprising a switch, wherein the processor is configured to receive the measured phases and amplitudes of the plurality of parallel transmission RF pulses from the plurality of directional couplers via the switch, the switch being switchable such that the measured phases and amplitudes of the plurality of parallel transmission RF pulses, and a plurality of reception RF pulses are receivable at the processor at different times.

20. The system of claim 19, wherein the processor being configured to calculate the measured local SAR value comprises the processor being configured to input the received measured phases and amplitudes of the plurality of parallel transmission RF pulses into a mathematical model representing the body and a plurality of transmission coils of the MRI system, and wherein the processor is further configured to generate the mathematical model by compressing a model of the body to be scanned by the MRI system into a plurality of voxel clusters, each voxel cluster of the plurality of voxel clusters defining a virtual observation point with a peak sensitivity to local SAR for the voxel cluster.

* * * * *